United States Patent [19]

Aipperspach et al.

[11] Patent Number: 4,910,574
[45] Date of Patent: Mar. 20, 1990

[54] POROUS CIRCUIT MACRO FOR SEMICONDUCTOR INTEGRATED CIRCUITS

[75] Inventors: Anthony G. Aipperspach; Dennis T. Cox, both of Rochester, Minn.; Joseph M. Fitzgerald, Austin, Tex.

[73] Assignee: IBM Corporation, Armonk, N.Y.

[21] Appl. No.: 315,209

[22] Filed: Feb. 23, 1989

Related U.S. Application Data

[63] Continuation of Ser. No. 44,872, Apr. 30, 1987, abandoned.

[51] Int. Cl.⁴ .............................................. H01L 27/02
[52] U.S. Cl. .......................................... 357/40; 357/71; 357/41; 357/45; 357/68; 365/230.01; 365/189.01
[58] Field of Search .................. 357/45, 45 M, 71, 68, 357/40, 41, 23.6; 365/230, 189

[56] References Cited

U.S. PATENT DOCUMENTS

| | | | |
|---|---|---|---|
| 4,021,838 | 5/1977 | Warwick | 357/40 X |
| 4,568,961 | 2/1986 | Noto | 357/40 X |
| 4,596,003 | 6/1986 | Shimizu | 365/230 |
| 4,677,592 | 6/1987 | Sakurai et al. | 365/230 |
| 4,688,070 | 8/1987 | Shiotari et al. | 357/45 X |
| 4,731,643 | 3/1988 | Dunham et al. | 357/40 X |
| 4,731,761 | 3/1988 | Kobayashi | 365/230 |
| 4,742,383 | 5/1988 | Fitzgerald | 357/45 |
| 4,811,073 | 3/1989 | Kitamura et al. | 357/40 X |

FOREIGN PATENT DOCUMENTS

| | | | |
|---|---|---|---|
| 57-196557 | 12/1982 | Japan | |
| 58-182242 | 10/1983 | Japan | 357/45 M |
| 59-36942 | 2/1984 | Japan | |
| 61-84030 | 4/1986 | Japan | 357/45 M |

Primary Examiner—William Mintel
Attorney, Agent, or Firm—Mason, Kolehmainen, Rathburn & Wyss

[57] ABSTRACT

A circuit macro is provided for a VLSI circuit device having a semiconductor substrate and M1 and M2 metal layers defining a grid of M1 and M2 conductive lines extending in orthogonal directions. Numerous similar unit cells are arrayed side-by-side in rows extending in one direction and each unit cell spans an integral number of M1 conductive lines and an integral number of M2 conductive lines. The circuit device includes a plurality of circuit blocks each including two of the rows of unit cells. A plurality of wiring bays extend between adjacent circuit blocks, and each wiring bay includes a plurality of M1 conductive lines. The circuit macro includes a number of circuti blocks separated by wiring bays, and connections extend to unit cells of circuit blocks included in the macro. Both M1 and M2 conductive lines are used for connections in the macro, and additional M1 and M2 conductive lines, including M1 connductive lines in the wiring bays, extend uninterrupted across the macro providing a porous yet dense macro and facilitating macro placement and wiring.

19 Claims, 2 Drawing Sheets

POROUS CIRCUIT MACRO FOR SEMICONDUCTOR INTEGRATED CIRCUITS

This application is a continuation of application Ser. No. 044,872, filed Apr. 30, 1987, now abandoned.

BACKGROUND OF THE INVENTION

The present invention relates to Very Large Scale Integrated (VLSI) semiconductor circuit devices and particularly to a structural arrangement and fabrication method for circuit macros for VLSI semiconductor integrated circuits.

VLSI devices are typically formed as circuit chips having a chip image including multiple logic and memory circuits integrally formed on a single semiconductor substrate. The VLSI devices may be formed, for example, by field effect transistor (FET) technique with conventional complementary metal oxide semiconductor (CMSO) technology. Whatever the technology employed, the semiconductor substrate surface is normally covered with a layer of insulation material which serves to protect the underlying semiconductor material and to provide a support for a first level or layer of metalization used for defining conductive lines. A second layer of metalization is carried by a second layer of insulation formed on the first metalization layer and is also used for defining conductive lines usually extending in a different direction. Additional metalization layers may be employed; however, this increases the complexity and two metalization layers are preferred.

VLSI devices are usually designed with a master image computer design system utilizing a library of predesigned functional circuit macros. The term "macro" designates a VLSI circuit arranged for a particular function. A design or chip image for a particular VLSI device is generated utilizing selected ones of the library of predesigned functional macros. An overall chip image is generated by the master image computer design system automatically locating or placing the selected macros on the chip and wiring these macros together to form the desired system.

Predesigned functional macros may include many different integrated circuits variying in complexity from simple inverter circuits to complex memory circuits. Conventionally, functional macros for VLSI devices have been designed with high circuit density in order to minimize semiconductor area and to provide a high performance characteristics for the particular function. This design approach, while providing additional macros with advantages for the intended function, creates serious problems in the layout and design of the overall chip image because the conventional design approach does not effectively facilitate placement and wiring of multiple macros on the chip to provide a desired system.

An example of a design suffering from these disadvantages is found in Balyoz et al., U.S. Pat. No. 4,249,193. This patent discloses a masterslice design technique wherein essentially the entire semiconductor surface area of each chip is utilized to provide cells selectable to be personalized (wired) with one of the semiconductor surface are dedicated for wiring channels. This high density approach to chip image structure decreases flexibility in wiring and macro placement.

Other VLSI chip or masterslice design techniques have made use of wiring bays between groups of cells of the chip array. However, large circuit macros developed in the past for such chips have been structured in such a way that large area blockage of metalization layers has resulted. This has prevented efficient use of the metalization layers and wiring bays. The prior art macro structures of FIGS. 1 and 2 provide examples of the difficulty.

Static random access memories (RAMS) are widely used in VLSI semiconductor devices. Present master image computer design systems generate semiconductor chip designs utilizing multiple versions of RAM macros. FIG. 1 illstrates a block diagram representation of a prior art static RAM macro with a single memory cell array ARRAY, a control section CNTL for address decoding and for providing timing signals to a word line selector section WORD DEC, a bit line selector section BIT SELECT and a sense latch section SENSE LATCHES. The SENSE LATCHES sense and latch read/write R/W data and drive the data outputs. Polysilicon word lines and first level metal bit lines (not shown) are typically used in this type of RAM macro to access the ARRAY.

The entire first metalization level above the semiconductor surface area defining the prior art RAM macro of FIG. 1 is totally used for defining conductive lines for both intra-cell and inter-cell wiring. This total blockage of the first metalization level results in placement limitations of the RAM macro in the chip image because no conductive lines in the first metalization layer are available for other purposes. Further, the number of macro blocks that can be combined to form the chip image is limited by the placement restrictions. Also, an increase in the ARRAY size requires an increased length in the polyisilicon word lines and correspondingly increased resistance. The performance characteristics are degraded due to the resulting increased propagation delay.

FIG. 2 illustrates an alternative prior art RAM arrangement utilized in an attempt reduce the length of the polysilicon word lines and avoid propagation delay problems. This macro includes four distributed memory cell ARRAYS, as shown. The control section CNTL is provided in the center area of the RAM macro and the WORD DEC, BIT SELECT AND BIT LATCHES sections are duplicated for the segmented ARRAYS, and, as compared to the prior art FIG. 1 macro, a larger semiconductor area is required. Like the design of FIG. 1, this design includes polysilicon word lines and first level metal bit lines to access the ARRAYS and results in a first level metal blockage for the RAM macro. Due to the congestion resulting from the centrally provided control section, blockage of a portion of the second level metal also results and wiring and macro placement problems are even more severe.

Many wiring techniques have been developed for the fabrication of semiconducor devices. The following patents disclose examples of such known techniques. None of these prior art approaches provides a structural arrangement complementing wireability of the overall chip image with macros defined to permit wiring through the macro utilizing both first and second wiring lines and enabling a dense macro effectively utilizing semiconductor area and having high performance characteristics.

Japanese specification No. 57-196557 discloses a method to facilitate automation of design of a semiconductor device wherein a semiconductor substrate is divided into sections consisting of sizes (x), (y), functional blocks are formed with the respective sections, and the relative distances between the respective blocks are made to differ by the integer times (x), (y) corresponding to quantities of mutal wirings of the functional blocks.

Japanese specification No. 59-36942 discloses a semiconductor integrated circuit with wiring channels arranged between rows of unit cells and between lines of every fixed number of unit cells.

Warwick, U.S. Pat. No. 4,021,838 discloses a large scale integrated circuit device with a number of integrated circuits or islands 2 arranged in rows and columns and having wiring channels 3 formed between the rows and columns.

Davis, U.S. pat. No. 4,518,874 discloses a bipolar transistor integrated circuit device with a first and second level metal lines connecting the array of bipolar transistors.

SUMMARY OF THE INVENTION

It is an important object of the invention to provide a structural arrangement for a circuit macro of a semiconductor integrated circuit device making possible a chip image including a plurality of functional macros and substantially eliminating placement restrictions of the functional macros. Other principal objects of this invention are to provide an improved macro structure and method for a semiconductor integrated circuit device including a semiconductor substrate and two levels of metalization for defining conductive lines; to provide a macro configuration improving overall chip wireability, minimizing both wiring density and wiring length; to provide a circuit macro that effectively utilizes semiconductor area to optimize both density and performance; and to provide a macro configuration that permits global wiring through the macro utilizing both levels of metalization.

In brief, the above and other objects and advantages of the present invention are achieved by providing a circuit macro and method for a semiconductor integrated device comprising a semiconductor substrate, a first metal level for defining a plurality of first conducting lines and a second metal level for defining a plurality of second conducting lines. A plurality of cells are formed in the semiconductor substrate. Each of the cells has a first dimension corresponding to a predetermined number of the second conducting lines and a predetermined number of logic service terminals. The cells are arranged in a plurality of dual rows and the dual rows are spaced apart by a distance corresponding to a predetermined number of the first conducting lines defining wiring bays therebetween. The cell logic service terminals are disposed adjacent to the wiring bays and at predetermined positions along said first cell dimension. A circuit macro in accordance with this invention is defined by interconnecting said plurality of cells by defining a subplurality of both of the first and second conducting lines to permit wiring through said functional macro utilizing both said first and second conducting lines.

The present invention further provides a functional macro in the form of a random access memory including a control block and a plurality of storage blocks. The control block is interconnected with the plurality of storage blocks utilizing predetermined ones of the second conducting lines.

DESCRIPTION OF THE VIEWS OF THE DRAWING

The present invention together with the above and other objects and advantages may best appear from the following detailed description of the preferred embodiment of the invention in which reference is made to the accompaying drawings wherein.

DETAILED DESCRIPTION

The present invention provides a circuit macro structure and method useful in designing macros of various types and degrees of complexity and in designing chip images using those macros. For purposes of illustration, the invention is described in connection with the RAM macro and chip image shown in the accompanying drawings, but it should be understood that the principles of the invention are not limited to this particular RAM macro.

Figure 1:
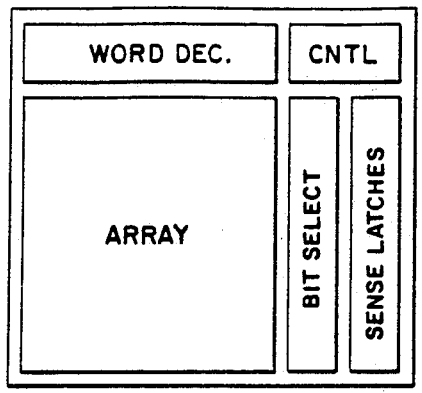
FIG. 1 is a block diagram view of a prior art random access memory arrangement.
Figure 2:
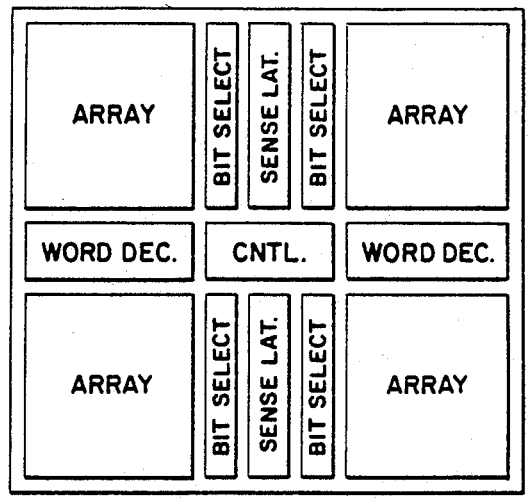
FIG. 2 is a block diagram view of an alternative prior art random access memory arrangement.
Figure 3:
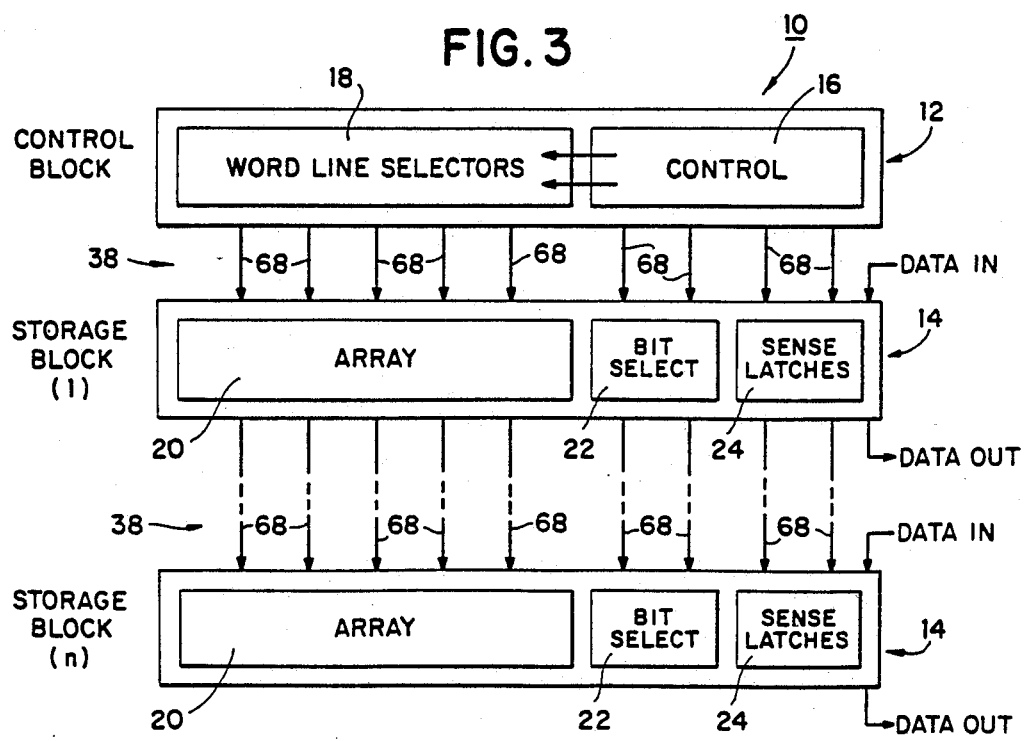
FIG. 3 is a block diagram view of a random access memory arrangement of the present invention.

Having reference now to FIG. 3, there is illustrated a RAM macro arranged in accordance with the present invention and designated in its entirety by the reference character 10. The RAM macro 10 includes a control block designated at 12 and a plurality of storage blocks (1)–(n) designated as 14. The RAM macro 10 may be formed, for example, by field effect transistor FET technique with conventional CMOS technology utilizing a first and second layer of metalization, as is described below with reference to FIG. 6.

The control block 12 includes a control section 16 for generating timing signals and for decoding address lines as well as a word line selector section 18. Each of the storage blocks 14 includes a memory cell array 20, a bit line selector section 22 and a sense latch section 24. The control block 12 is interconnected with each of the storage blocks 14. Word lines from the word line selector section 18 access the memory cell array 20 of each of the storage blocks 14. Input lines to both the bit selector section 22 and the sense latch section 24 are provided from the control section 16 of the control block 12. As appears below, the second metalization layer is used to provide these signal lines.

Figure 4:
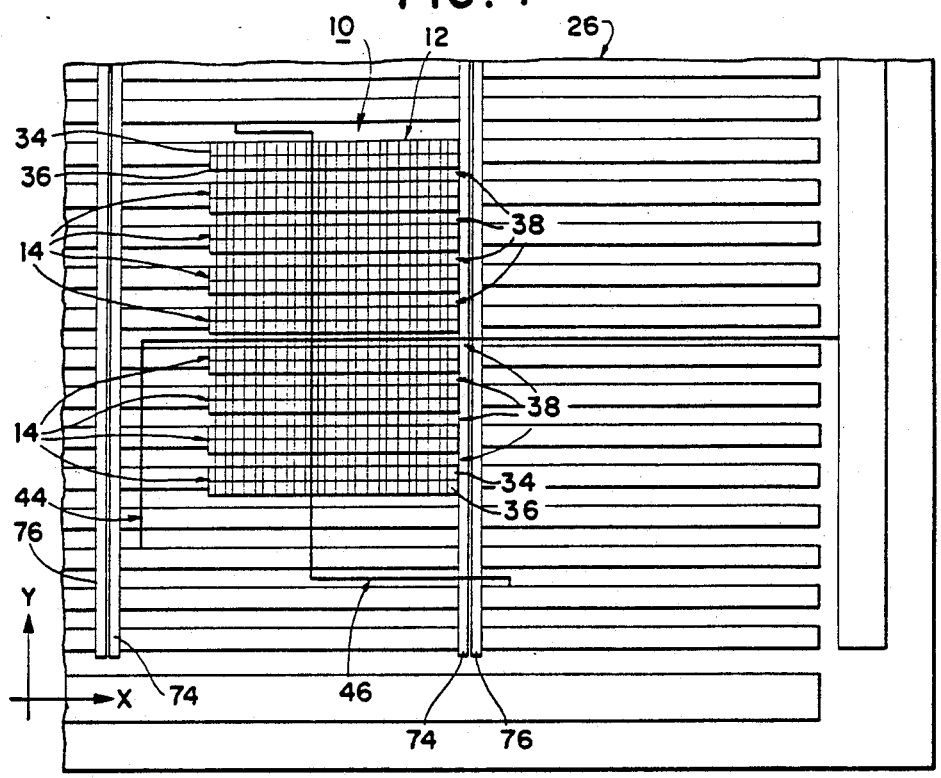
FIG. 4 is a fragmentary, enlarged plan view of a semiconductor chip with a cell arrangement in accordance with the present invention.
Figure 5:
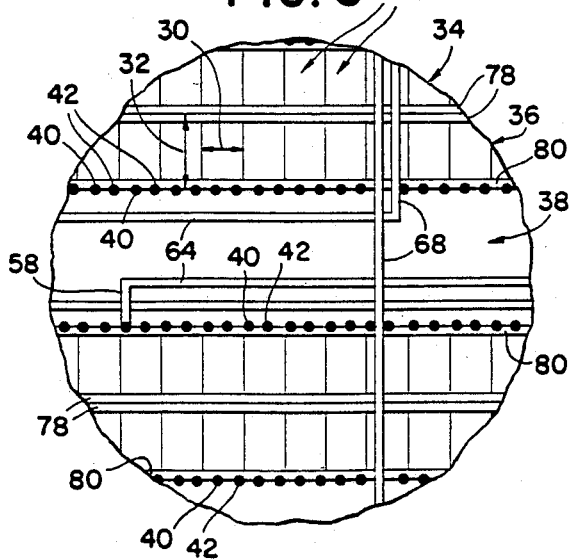
FIG. 5 is an enlarged plan view illustrating the cell configuration of the semiconductor chip layout of FIG. 4.
Figure 6:
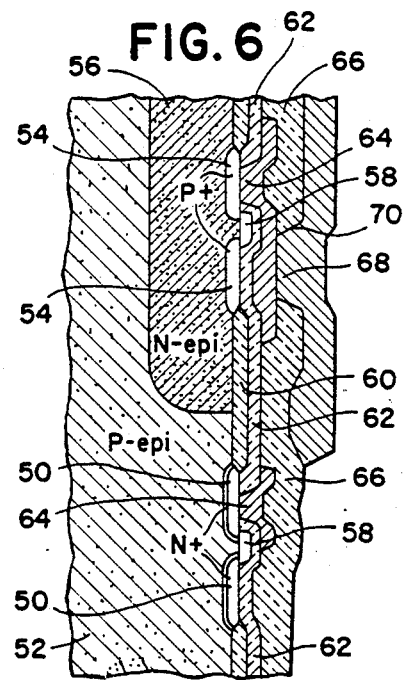
FIG. 6 is an enlarged cross-sectional view of a small portion of a semiconductor device in accordance with the present invention and specifically illustrating the two levels of metalization.

Referring now to FIGS. 4–6, the semiconductor structural arrangement of the invention and the fabrication of the RAM macro 10 are illustrated. A fragmentary portion of a total chip image designated as 26 is shown in FIG. 4. The chip image 26 includes a RAM macro 10 of the type shown in FIG. 3. Although not illustrated in the drawings, chip image 26 may include several macros 10 and/or other macros, with flexibility of wiring and placement maximized by the present invention.

In the chip image 26, a first level of metalization M1 defines wiring lines extending in an X direction (from left to right or horizontally as shown in FIG. 4). A second level of metalization M2 defines wiring lines extending in a Y direction, orthogonally to the first level M1 lines (vertically as shown in FIG. 4). Thus the first and second wiring lines are arrayed in an X-Y matrix or grid. The chip image 26 is defined within this grid system. The grid has dimensions corresponding to a first level metal M1 wiring pitch of, for example, 3.2 micrometers by a second level metal M2 wiring pitch of 4.4 micrometers.

Each of a plurality of unit cells 28 is defined in the semiconductor substrate grid utilizing a standard semiconductor area as illustrated in enlarged detail in FIG. 5. Unit cells 28 include a plurality of active and passive devices that define fundamental circuit elements that are employed to construct circuits, functional macros such as RAM macro 10 and an overall chip system such as that represented by the chip image 26. A first cell dimension 30 is provided corresponding to a selected integer number, such as four, of the second level metal pitch increments or 17.6 micrometers. A second cell dimension 32 is provided corresponding to a selected integer number, such as twenty, of the first level metal pitch increments or 64 micrometers.

The standard size cells 28 are arranged side-by-side in numerous rows extending in the X direction. These rows are arranged in pairs with the cells of each row of each pair in end-to-end relation. A plurality of these dual rows designated as 34 and 36 extend in the X direction. Each dual row 34, 36 defines a block spaced apart in the Y direction from other blocks to define a wiring bay 38 extending in the X direction between each adjacent pair of blocks or dual cell rows. Each wiring bay 38 includes, for example, thirty M1 wiring channels.

A pair of logic service terminals 40 and 42 is provided for each cell 28. The logic service terminals 40 and 42 are disposed adjacent to a wiring bay 38 and alternate M2 wiring channels, as shown. Each of the dual rows contains a predetermined number of cells, for example 432 cells with the internal chip defining 70 rows for a total of 30,240 cells per chip.

FIG. 4 shows by way of example a pair of global logic service terminal (LST) interconnections 44 and 46 extending through the RAM macro 10. Other similar connections are made to the cells 28 of the RAM macro 10. Wires 44 and 46 are defined in part by M1 conductive lines within the wiring bays 38 and in part by M2 conductive lines extending across the cells 28. As shown, the control block 12 of the RAM macro is defined by an upper block of dual rows 34 and 36. The multiple storage blocks 14 are each defined by another block of dual rows 34 and 36.

Each end-to-end cell pair spans four M2 conductive lines and includes four logic service terminals. Only selected ones of the logic service terminals are used in any macro design, and many of the M2 conductive lines crossing the RAM macro 10 are unused and available for other purposes. In the illustrated embodiment, about one-half of the M2 lines are required for the RAM macro 10. The remaining unused M2 conductive lines extend through the chip without interruption.

In FIG. 6, a cross-sectional view of an illustrative small portion of a very large scale integrated device is shown. The structure of the CMOS chip includes N-channel devices 50 formed in a P-epitaxial layer 52 and P-channel devices 54 formed in an N-epitaxial layer 56.

A polysilicon layer 58 is formed between the N+ regions 50 and the P+ regions 56. Polysilicon layer 58 provides lines used for interconnecting the logic service terminals of the cells 28 with the M1 wiring lines within the wiring bays 38.

The N+ regions 50 and the P+ regions 54 are isolated one from another by oxide isolation (silicon dioxide) regions 60. An insulation (boron phosphorus silicon glass) layer 62 is superimposed on the silicon dioxide insulation layer 60, the polysilicon layer 58 and regions 50 and 54. A first level metalization M1 layer 64 is carried by the insulation layer 62. An insulation (polyimide nitride) layer 66 is formed over the M1 layer 64. A second level metalization M2 layer 68 is formed on the insulation layer 66. The M1 and M2 layers 64 and 68 can be formed of aluminum with conductive lines or wires formed in accordance with conventional vacuum deposition or etching techniques. Via holes 70 are formed in the insulation layer 66 by conventional masking technique for interconnecting the first and second metal M1 and M2 lines at selected points. Via holes 72 similarly are formed in the insulation layer 62 for connecting the M1 lines to the P+ regions 54 and the N+ regions 50 at selected points. In the specific embodiment illustrated, contacts to polysilicon layer 58 and diffusion regions 50 and 54 are about one micrometer by one micrometer.

In FIG. 4, M1 conductive lines provide intra-cell connections within the cells 28 and also interconnect the cells within each of the dual rows 34 and 36. As a result, the M1 layer 64 may be partly or even fully blocked in the areas of blocks 12 and 14. However, only a limited number of the wiring channels defined by the wiring bays 38 is employed for intercell wiring. Many of the wiring channels in each wiring bay 38 are left available to permit wiring through the macro 10 along the M1 layer 64. A limited number of M2 conductive lines are formed for connecting between the cells contained within the block 12 and the cells contained within each of the blocks 14. Since wiring bays 38 with uninterrupted M1 conductive lines extend between all blocks 12 and 14, and since only a portion of the possible M2 channels are used for interconnections between blocks 12 and 14, a porous configuration is achieved in which global wiring can extend in both the X and the Y directions across the chip directly through the macro 10.

A power distribution system is provided by pairs of +5 Volt power supply and ground M2 power busses 74 and 76 to distribute power in the Y direction within the chip 26. A plurality of pairs of +5 Volt power supply and ground M1 busses 78 and 80 are connected to the M2 power busses 74 and 76 and distribute power in the X direction. A +5 Volt M1 bus 78 is provided for each of the cell rows 34 and 36 adjacent to the boundary between the rows of cells 28. A horizontal ground M1 bus 80 is provided for each of the cell rows adjacent to the wiring bays 38.

Ram macro 10 is shown in FIG. 4 proximate to the M2 power busses 74 and 76. This position is only one representative possible position for the RAM macro. For example, the RAM macro could be centrally positioned between the pairs of M2 power busses shown in FIG. 4. Internal power connections are made within the RAM macro 10 without interrupting the M1 power busses 78 and 80 that extend through the macro. Since the power distribution system is not affected by the position of the macro 10, no limitations result with respect to relative placement of other macros in the chip 26.

The selected cell dimension 32 should be sufficiently large to accommodate the M1 busses 78 and 80 and the M1 intra-cell and inter-cell wiring for the cells 28 within the rows 36 and 36. The maximum number of two LST's 40 and 42 per cell 28 and the cell width or dimension 30 is selected to minimize unused silicon area within the chip while providing sufficient M2 wiring channels for wiring the entire chip 26. Utilizing the same physical size and LST position for the cells 28 enables performance optimization without affecting the chip wireability.

Great flexibility is achieved in both placement and wiring of a chip device. For example, macros of any size and complexity can be located close to one another in either the Y or X direction without problems resulting from total blockage of large sections of the wiring planes. Macros can be placed near the chip periphery without obstructing the input/output ports. A relatively large number of macros can be formed in a single chip without the wiring restrictions experienced with nonporous designs. A master image design system can provide chip images with both high density and good performance since the macros are designed as a series of small blocks rather than as larger, dense units. Various different array sizes can be easily configured.

We claim:

1. A VLSI circuit device of the type including a semiconductor substrate disposed below a first metal layer and a second metal layer disposed above said first metal layer, said first and second metal layers defining a grid of first and second conductive lines extending in first and second direction, said circuit device comprising:
   numerous similar unit cells arrayed side-by-side in rows extending in the first direction, each unit cell spanning an integral number of first conductive lines and an integral number of second conductive lines;
   an array of circuit blocks each including two of said rows of unit cells;
   a plurality of wiring bays extending in said first direction between respective adjacent ones of said circuit blocks, each including a plurality of said first conductive lines; and
   at least one circuit macro;
   said circuit device being characterized by said circuit macro including a plurality of predetermined circuit blocks separated by said wiring bays and including connections extending to unit cells of said predetermined circuit blocks, said circuit macro spanning a first number of said first conductive lines and a second number of said second conductive lines;
   said second number of second conductive lines including one portion use for said connections and another portion extending substantially uninterrupted in said second direction across said macro; and
   said first member of first conductive lines including a first portion used for said connections and a second portion extending substantially uninterrupted in said first direction across said macro, at least some of said second portion of said first number of first conductive lines being located in said wiring bays.

2. A VLSI circuit device as claimed in claim 1, each of said unit cells including terminals located adjacent one of said wiring bays.

3. A VLSI circuit device as claimed in claim 2, each of said unit cell including two terminals, the unit cells of the rows in each of said circuit blocks being arrayed end-to-end and spanning four of the second conductive lines.

4. A VLSI circuit device as claimed in claim 1 wherein one of said wiring bays is located between respective adjacent ones of said circuit blocks included in said circuit macro.

5. A semiconductor integrated circuit comprising:
   a semiconductor substrate,
   a first metal level disposed above said semiconductor substrate for defining a plurality of first conducting lines,
   a second metal level disposed above said first metal level for defining a plurality of second conducting lines,
   a plurality of cells formed in said semiconductor substrate, each of said cells having a first dimension corresponding to a predetermined number of said second conducting lines and having a second dimension corresponding to a predetermined number of said first conducting lines and each of said cells having a predetermined number of terminals,
   said cells being arranged in a plurality of dual cell rows, each of said dual cell rows containing a subplurality of cells, said dual cell rows being spaced apart corresponding to a predetermined number of said first conducting lines defining a wiring bay between adjacent ones of said spaced apart dual cell rows,
   said predetermined number of terminals of each of said cells being disposed adjacent to said wiring bay and at predetermined positions along said first cell dimension, and
   said semiconductor integrated circuit being characterized by a functional macro defined by interconnecting a plurality of adjacent ones of said dual cell rows by selectively defining a subplurality of both of said first and said second conducting lines to permit substantially uninterrupted wiring across said functional macro utilizing both said first and second conducting lines.

6. A semiconductor integrated circuit as recited in claim 5 wherein said functional macro is configured to define a control block and a plurality of storage blocks, said control block interconnected with said plurality of storage blocks utilizing predetermined ones of said second conducting lines.

7. A semiconductor integrated circuit as recited in claim 6 wherein said functional macro is a random access memory and said control block includes a control section for generating address signals and for generating timing signals and a word line selector section, and each of said storage blocks includes a memory cell array and a bit line selector section and a sense latch section.

8. A semiconductor integrated circuit as recited in claim 5 further including a ground bus defined by a first conducting line adjacent to said wiring bays and a voltage supply bus defined by a first conducting line spaced apart from said ground bus within each cell row;
   said ground and voltage busses extending uninterrupted through said functional macro and providing power connections to cells within said functional macro.

9. A semiconductor integrated circuit as recited in claim 5 wherein said semiconductor substrate includes a polysilicon layer, said polysilicon layer being used for selectively interconnecting said cell terminals and first conducting lines defined within said wiring bays.

10. A semiconductor integrated circuit as recited in claim 5 wherein said first and second conducting lines are orthogonal.

11. A semiconductor integrated circuit as recited in claim 5 wherein said first cell dimension corresponds to four of said second conducting lines.

12. A semiconductor integrated circuit as recited in claim 5 wherein said cells have two terminals.

13. A semiconductor integrated circuit as recited in claim 11 further including at least a pair of ground and voltage supply busses defined by second conducting lines.

14. A semiconductor integrated circuit random access memory comprising:
   a semiconductor substrate,
   a first metal level disposed above said semiconductor substrate for defining a plurality of first conducting lines,
   a second metal level disposed above said first metal level for defining a plurality of second conducting lines,
   a plurality of cells formed in said semiconductor substrate, each of said cells having a first dimension corresponding to a predetermined number of said second conducting lines and having a second dimension corresponding to a predetermined number of said first conducting lines and each of said cells having a predetermined number of terminals,
   said cells being arranged in a plurality of rows of cells, at least some of said cell rows being spaced apart corresponding to a predetermined number of said first conducting lines defining a wiring bay between adjacent ones of said spaced apart cell rows,
   said predetermined number of terminals of each of said cells being disposed adjacent to said wiring bay and at predefined positions along said first cell dimension;
   a control block defined by a subplurality of cells within a first group of said cell rows,
   a plurality of storage blocks, said storage blocks separately defined by a subplurality of cells within respective ones of a plurality of second groups of said cell rows;
   said control block being interconnected with said plurality of storage blocks by defining a subplurality of predetermined ones of said second conducting lines; and
   a portion of said first and second conducting lines extending substantially uninterrupted across the random access memory.

15. A semiconductor integrated circuit random access memory as recited in claim 14 wherein said control block includes a control section for generating timing signals and for decoding address signals and a word line selector section for providing word line signals.

16. A semiconductor integrated circuit random access memory as recited in claim 14 wherein each of said plurality of storage blocks includes a memory cell array and a bit line selector section and a sense latch section.

17. A semiconductor integrated circuit random access memory as recited in claiim 14 in which said first and second groups of cells are dual cell rows.

18. A semiconductor integrated circuit random access memory as recited in claim 17 wherein said first cell dimension corresponds to four of said second conducting lines.

19. A semiconductor integrated circuit random access memory as recited in claim 14 wherein said cells have two terminals.

* * * * *

UNITED STATES PATENT AND TRADEMARK OFFICE
CERTIFICATE OF CORRECTION

PATENT NO. : 4,910,574
DATED : March 20, 1990
INVENTOR(S) : Aipperspach et al.

It is certified that error appears in the above-identified patent and that said Letters Patent is hereby corrected as shown below:

Column 7, line 34, change "direction" to --directions--.

Column 7, line 57, change "use" to --used--.

Column 7, line 61, change "member" to --number--.

Column 8, line 5, change "cell" to --cells--.

Column 10, line 30, change "claiim" to --claim--.

Signed and Sealed this

Sixteenth Day of July, 1991

Attest:

HARRY F. MANBECK, JR.

Attesting Officer

Commissioner of Patents and Trademarks